(12) United States Patent
Terada et al.

(10) Patent No.: US 10,507,631 B2
(45) Date of Patent: Dec. 17, 2019

(54) LAMINATE, PRINTED CIRCUIT BOARD AND METHOD FOR PRODUCING LAMINATE

(71) Applicant: AGC Inc., Chiyoda-ku (JP)

(72) Inventors: Tatsuya Terada, Chiyoda-ku (JP); Toru Sasaki, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/152,637

(22) Filed: Oct. 5, 2018

(65) Prior Publication Data

US 2019/0030870 A1 Jan. 31, 2019

Related U.S. Application Data

(63) Continuation of application No. PCT/JP2017/014691, filed on Apr. 10, 2017.

(30) Foreign Application Priority Data

Apr. 11, 2016 (JP) .................................. 2016-078950

(51) Int. Cl.
*B32B 27/08* (2006.01)
*B32B 7/02* (2019.01)
(Continued)

(52) U.S. Cl.
CPC ................ *B32B 27/08* (2013.01); *B32B 7/02* (2013.01); *B32B 15/04* (2013.01); *B32B 15/08* (2013.01);
(Continued)

(58) Field of Classification Search
CPC ...... B32B 27/08; H05K 1/036; H05K 3/4655; H05K 2201/015; H05K 2201/0145; H05K 2201/0141; H05K 2201/0129
(Continued)

(56) References Cited

U.S. PATENT DOCUMENTS 6,166,138 A 12/2000 Kolouch
2003/0118836 A1 6/2003 Lee et al.
(Continued)

FOREIGN PATENT DOCUMENTS

JP 2001-187833 7/2001
JP 2005-105165 4/2005
(Continued)

OTHER PUBLICATIONS

International Search Report dated Jul. 11, 2017 in PCT/JP2017/014691, filed on Apr. 10, 2017 (with English Translation).
(Continued)

*Primary Examiner* — Sherman Ng
(74) *Attorney, Agent, or Firm* — Oblon, McClelland, Maier & Neustadt, L.L.P.

(57) ABSTRACT

To provide a laminate having a fluororesin layer and a thermoplastic resin layer laminated with a good adhesive strength.
A method for producing a laminate, comprising carrying out heat lamination of a fluororesin film containing the following fluororesin (A) and a thermoplastic resin film containing a thermoplastic resin (B) having a melting point higher by at least 5° C. than the melting point of the fluororesin (A), at a temperature of at least a melting point of the fluororesin (A) and lower than a melting point of the thermoplastic resin (B). The fluororesin (A) is a fluororesin having at least one functional group selected from the group consisting of a carbonyl group-containing group, a hydroxy group, an epoxy group and an isocyanate group, and having a melt flow rate of from 0.5 to 30 g/10 min at 372° C. under a load of 49N.

14 Claims, 1 Drawing Sheet

(51) Int. Cl.
*B32B 15/04* (2006.01)
*B32B 15/082* (2006.01)
*B32B 27/30* (2006.01)
*H05K 1/03* (2006.01)
*B32B 15/08* (2006.01)
*B32B 37/18* (2006.01)
*H05K 3/46* (2006.01)

(52) U.S. Cl.
CPC ............ *B32B 15/082* (2013.01); *B32B 27/30* (2013.01); *B32B 37/182* (2013.01); *H05K 1/03* (2013.01); *H05K 1/036* (2013.01); *H05K 3/4655* (2013.01); *B32B 2457/08* (2013.01); *H05K 2201/015* (2013.01); *H05K 2201/0129* (2013.01); *H05K 2201/0141* (2013.01); *H05K 2201/0145* (2013.01); *H05K 2201/0195* (2013.01); *H05K 2203/068* (2013.01)

(58) Field of Classification Search
USPC ....................................................... 174/258
See application file for complete search history.

(56) References Cited

U.S. PATENT DOCUMENTS

| | | | | |
|---|---|---|---|---|
| 2004/0038039 A1* | 2/2004 | Sandland | ................ | B32B 25/14 428/421 |
| 2005/0084684 A1* | 4/2005 | Yamamoto | .............. | B29C 33/68 428/422 |
| 2005/0236182 A1* | 10/2005 | Hayashi | ................. | H05K 3/108 174/262 |
| 2008/0102285 A1* | 5/2008 | Aida | ....................... | B32B 27/28 428/421 |
| 2008/0107866 A1* | 5/2008 | Iwasa | ..................... | B32B 15/08 428/141 |
| 2014/0329968 A1* | 11/2014 | Masuda | .................. | C08L 71/00 525/153 |

FOREIGN PATENT DOCUMENTS

| | | |
|---|---|---|
| JP | 4014964 | 11/2007 |
| JP | 2014-223798 | 12/2014 |
| JP | 5674405 | 2/2015 |
| JP | 2016-124909 | 7/2016 |
| WO | WO 2006/067970 A1 | 6/2006 |

OTHER PUBLICATIONS

Victrex® Peek 381G, Victrex® High Performance Paek Polymers, 2014, pp. 2.

\* cited by examiner

LAMINATE, PRINTED CIRCUIT BOARD AND METHOD FOR PRODUCING LAMINATE

TECHNICAL FIELD

The present invention relates to a laminate, a method for producing the same, and a printed circuit board provided with the laminate.

BACKGROUND ART

A printed circuit board is produced, for example, by a process of laminating a metal foil (such as a copper foil) layer as a conductive layer, on an insulating substrate, and etching the metal foil for removing unnecessary portions so as to form a patterned circuit. As a material for the insulating substrate, a fluororesin film excellent in dielectric properties or a polyimide film excellent in heat resistance is known.

Further, Patent Document 1 proposes a thermoplastic liquid crystal polymer film having a low dielectric constant and being suitable as an insulating substrate.

PRIOR ART DOCUMENTS

Patent Documents

Patent Document 1: Japanese Patent No. 5674405

DISCLOSURE OF INVENTION

Technical Problem

Recently, along with high-speed signal propagation and high frequency, an insulating substrate is desired to have a lower dielectric constant. However, electric properties of the thermoplastic liquid crystal polymer film described in Patent Document 1 are not necessarily sufficient, and further improvement is required.

In view of this, the present inventors conceived lamination of a thermoplastic liquid crystal polymer film and a fluororesin film, but a fluororesin tends to have a low adhesion to other materials, and therefore, a fluororesin film and a thermoplastic resin film are not easily bonded with a sufficient strength.

It is an object of the present invention to provide a laminate having a fluororesin layer and a thermoplastic resin layer laminated with a good adhesive strength, a method for producing the same, and a printed circuit board provided with the laminate.

Solution to Problem

The present invention has the following embodiments.

[1] A laminate comprising a fluororesin layer containing a fluororesin and a thermoplastic resin layer containing a thermoplastic resin, directly laminated on at least one side of the fluororesin layer,
wherein the fluororesin has at least one functional group selected from the group consisting of a carbonyl group-containing group, a hydroxy group, an epoxy group and an isocyanate group, and has a melt flow rate of from 0.5 to 30 g/10 min at 372° C. under a load of 49N, and
the thermoplastic resin has a melting point higher by at least 5° C. than the melting point of the fluororesin.
[2] The laminate according to [1], wherein the thermoplastic resin layer is a thermoplastic liquid crystal polymer.
[3] The laminate according to [2], wherein the thermoplastic liquid crystal polymer is selected from the group consisting of a thermoplastic liquid crystal polyester, a thermoplastic liquid crystal polyester amide having an amide bond introduced to the thermoplastic liquid crystal polyester, and a polymer having an imide bond, a carbonate bond, a carbodiimide bond or an isocyanate-derived bond introduced to an aromatic polyester or an aromatic polyester amide.
[4] The laminate according to any one of [1] to [3], wherein the melting point of the thermoplastic resin is lower than 360° C.
[5] The laminate according to any one of [1] to [4], wherein the melting point of the fluororesin is from 250 to 320° C.
[6] The laminate according to any one of [1] to [5], wherein the functional group is a group derived from at least one member selected from the group consisting of a monomer, a chain transfer agent and a polymerization initiator, used for producing the fluororesin.
[7] The laminate according to any one of [1] to [6], wherein the fluororesin has monomer units based on tetrafluoroethylene, monomer units based on a cyclic hydrocarbon monomer having an acid anhydride group and monomer units based on a fluorinated monomer (excluding tetrafluoroethylene).
[8] The laminate according to any one of [1] to [7], which has a metal foil layer on a surface of the thermoplastic resin layer opposite from the surface contacting the fluororesin layer.
[9] A printed circuit board provided with the laminate as defined in [8], wherein the metal foil layer is a patterned circuit.
[10] A method for producing a laminate, said method comprising carrying out heat lamination of a fluororesin film containing a fluororesin and a thermoplastic resin film containing a thermoplastic resin, at a temperature of at least a melting point of the fluororesin and lower than a melting point of the thermoplastic resin,
wherein the fluororesin has at least one functional group selected from the group consisting of a carbonyl group-containing group, a hydroxy group, an epoxy group and an isocyanate group, and has a melt flow rate of from 0.5 to 30 g/10 min at 372° C. under a load of 49N, and
the melting point of the thermoplastic resin is higher by at least 5° C. than the melting point of the fluororesin.
[11] The method for producing a laminate according to [10], wherein the thermoplastic resin is a thermoplastic liquid crystal polymer.
[12] The method for producing a laminate according to [10] or [11], wherein the temperature for heat lamination is higher by at least 20° C. than the melting point of the fluororesin and further lower by at least 3° C. than the melting point of the thermoplastic resin.
[13] The method for producing a laminate according to any one of [10] to [12], wherein the temperature for heat lamination is from 280 to 357° C.
[14] The method for producing a laminate according to any one of [10] to [13], wherein a pressure for heat lamination is from 0.5 to 7 MPa.
[15] The method for producing a laminate according to any one of [11] to [14], wherein the thermoplastic liquid crystal polymer is selected from the group consisting of a thermoplastic liquid crystal polyester, a thermoplastic liquid crystal polyester amide having an amide bond introduced to the thermoplastic liquid crystal polyester, and a polymer having an imide bond, a carbonate bond, a carbodiimide bond or an isocyanate-derived bond introduced to an aromatic polyester or an aromatic polyester amide.

[16] The method for producing a laminate according to any one of [10] to [15], wherein the fluororesin has monomer units based on tetrafluoroethylene, monomer units based on a cyclic hydrocarbon monomer having an acid anhydride group and monomer units based on a fluorinated monomer (excluding tetrafluoroethylene).

Advantageous Effects of Invention

According to the present invention, it is possible to obtain a laminate having a fluororesin layer and a thermoplastic resin layer laminated with a good adhesive strength, and a printed circuit board provided with the laminate.

DESCRIPTION OF EMBODIMENTS

The following definitions of terms apply throughout the specification including the claims.

The "melting point" means a temperature corresponding to the maximum value of the melting peak measured by differential scanning calorimetry (DSC) method.

"Melt-flowability is secured" means that a temperature at which the melt flow rate is from 0.5 to 1,000 g/10 min is secured at a temperature higher by at least 20° C. than the melting point of the resin under a load of 49 N.

The "melt flow rate" means a melt mass flow rate (MFR) as defined in JIS K7210:1999 (ISO1133:1997).

<Laminate>

The laminate of the present invention is obtained by the after-described method for producing a laminate of the present invention.

The laminate of the present invention may be an insulating substrate used as a material for a flexible printed circuit board, or a laminate having an insulating substrate and an electrical conductive layer (so-called a flexible metal-clad laminate).

The laminate of the present invention has a fluororesin layer and a thermoplastic resin layer directly laminated on at least one surface of the fluororesin layer. That is, the fluororesin layer and the thermoplastic resin layer are laminated so as to be in contact with each other. A metal foil layer may be provided on a surface of the thermoplastic resin layer, opposite from the surface contacting the fluororesin layer.

Figure 1:
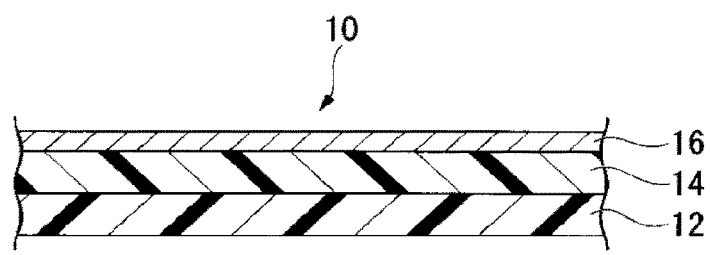
FIG. 1 is a cross-sectional view schematically illustrating one example of the laminate of the present invention.

FIG. 1 is a cross-sectional view illustrating one example of the laminate of the present invention. The laminate 10 has a fluororesin layer 12 and a thermoplastic resin layer 14 laminated on the first surface of the fluororesin layer 12. A metal foil layer 16 is laminated on a surface of the thermoplastic resin layer 14 opposite from the surface contacting the fluororesin layer 12.

Figure 2:
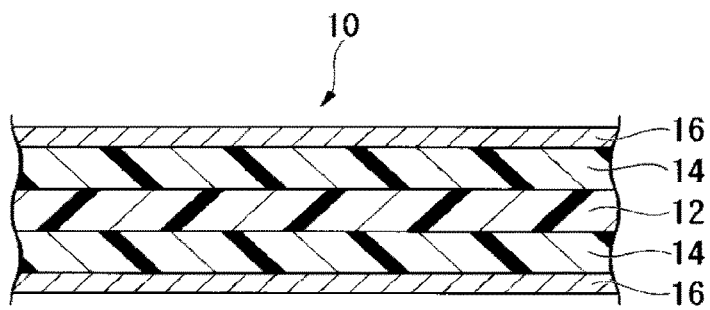
FIG. 2 is a cross-sectional view schematically illustrating another example of the laminate of the present invention.

FIG. 2 is a cross-sectional view illustrating another example of the laminate of the present invention. The laminate 10 has a fluororesin layer 12, and two thermoplastic resin layers 14 laminated on the first surface and the second surface of the fluororesin layer 12. Metal foil layers 16 are respectively laminated on a surface of the respective thermoplastic resin layers 14 opposite from the surface contacting the fluororesin layer 12.

In the example of each of FIG. 1 and FIG. 2, the thermoplastic resin layer 14 and the metal foil layer 16 are laminated so as to be in contact with each other, but a layer made of a known adhesive material may be interposed between these layers.

The thickness of the laminate of the present invention is not particularly limited.

For example, the thickness of the flexible metal-clad laminate is usually from 1 to 2,500 µm, and the thickness of the laminate of the present invention is preferably within this range. The thickness is preferably from 1 to 2,500 µm, more preferably from 2 to 1,000 µm, furthermore preferably from 3 to 700 µm, particularly preferably from 5 to 300 µm.

<Fluororesin Layer>

The fluororesin layer is a layer made of the after-described fluororesin film, containing a specific fluororesin (A). The fluororesin layer may contain e.g. another resin or an additive.

The fluororesin layer may have a single layer structure or a laminated structure having two or more layers.

The thickness of the fluororesin layer is usually from 0.5 to 1,000 µm, and from the viewpoint of heat resistance to a soldering iron, the thickness is preferably from 1 to 200 µm, more preferably from 3 to 150 µm, furthermore preferably from 5 to 100 µm. When the thickness is at most the above upper limit value, the entire thickness of a laminate can be small. When the thickness is at least the above lower limit value, the electrical insulating properties will be excellent. Further, when a thermoplastic resin layer is exposed to the atmosphere corresponding to solder reflow at a high temperature, swelling (foaming) of the fluororesin layer due to heat is less likely to occur.

The fluororesin (A) contained in the fluororesin layer may be one type or two or more types.

The content of the fluororesin (A) in the fluororesin layer is preferably at least 50 mass %, more preferably at least 80 mass %, per 100 mass % of the fluororesin layer, from the viewpoint of adhesive strength between the fluororesin layer and the thermoplastic resin layer. The upper limit of the content is not particularly limited and may be 100 mass %.

[Fluororesin (A)]

The fluororesin (A) is a fluororesin having at least one functional group (hereinafter, referred to as functional group (I)) selected from the group consisting of a carbonyl group-containing group, a hydroxy group, an epoxy group and an isocyanate group. By the functional group (I), the adhesive strength between the thermoplastic resin layer and the fluororesin layer containing the fluororesin (A) becomes high.

The functional group (I) is preferably present as either one or both of a terminal group of the main chain and a pendant group of the main chain of the fluororesin (A), from the viewpoint of adhesive strength.

The functional group (I) may be one type or two or more types.

The fluororesin (A) preferably has, as the functional group (I), at least a carbonyl group-containing group, from the viewpoint of the adhesive strength to the thermoplastic resin layer. The carbonyl group-containing group may, for example, be a group having a carbonyl group between carbon atoms in a hydrocarbon group, a carbonate group, a carboxy group, a haloformyl group, an alkoxycarbonyl group or an acid anhydride group.

With respect to the hydrocarbon group in the group having a carbonyl group between carbon atoms, the hydrocarbon group may, for example, be a linear or branched $C_{2-8}$ alkylene group. Here, the number of carbon atoms in the alkylene group is a number of carbon atoms not including the carbonyl group.

The haloformyl group is represented by —C(=O)—X (wherein X is a halogen atom). The halogen atom may, for example, be a fluorine atom or a chlorine atom, preferably a fluorine atom. The haloformyl group is preferably a fluoroformyl group (also called a carbonyl fluoride group).

The alkoxy group in the alkoxycarbonyl group may be linear or branched, preferably a $C_{1-8}$ alkoxy group, particularly preferably a methoxy group or an ethoxy group.

The content of the functional group (I) in the fluororesin (A) is preferably from 10 to 60,000 groups, more preferably from 100 to 50,000 groups, furthermore preferably from 100 to 10,000 groups, particularly preferably from 300 to 5,000 groups, per $1 \times 10^6$ carbon atoms in the main chain of the fluororesin (A). When the content is at least the above lower limit value, the adhesive strength between the fluororesin layer and the thermoplastic resin further increases. When the content is at most the above upper limit value, the adhesive strength between the fluororesin layer and the thermoplastic resin can be increased even when a heat lamination temperature is lowered.

The content may be measured by means of e.g. nuclear magnetic resonance (NMR) analysis or infrared absorption spectrum analysis. For example, by means of e.g. infrared absorption spectrum analysis as disclosed in JP-A-2007-314720, the proportion (mol %) of the structural units having the functional group (I) in all the structural units constituting the fluororesin (A) is determined, and from the proportion, the content of the functional group (I) can be calculated.

The melting point of the fluororesin (A) is preferably from 250 to 320° C., more preferably from 280 to 315° C., furthermore preferably from 290 to 310° C. When the melting point is at least the above lower limit value, the heat resistance of the fluororesin layer is excellent. When the melting point is at most the above upper limit value, the fluororesin (A) is excellent in forming property.

The melting point can be adjusted by e.g. the type or the proportion of structural units constituting the fluororesin (A) or the molecular weight of the fluororesin (A). For example, the larger the proportion of the after-described structural units (u1) becomes, the more the melting point tends to increase.

The fluororesin (A) has a melt flow rate of from 0.5 to 30 g/10 min at 372° C. under a load of 49N. When the melt flow rate is at most the above upper limit value, the adhesive strength between the fluororesin layer and the thermoplastic resin becomes high. When the melt flow rate is at least the above lower limit value, the fluororesin (A) is excellent in forming property, and the resulting fluororesin layer is excellent in surface smoothness and appearance. The melt flow rate is preferably from 1 to 25 g/10 min, more preferably from 1 to 20 g/10 min, furthermore preferably from 1 to 15 g/10 min.

The melt flow rate is an index for the molecular weight of the fluororesin (A), and a high melt flow rate indicates a low molecular weight, and a low melt flow rate indicates a high molecular weight. The molecular weight of the fluororesin (A), and thus the melt flow rate, can be adjusted by the conditions for producing the fluororesin (A). For example, if the polymerization time is shortened at the time of polymerization of the monomer, the melt flow rate tends to increase. In order to reduce the melt flow rate, a method of subjecting the fluororesin (A) to heat treatment so as to form a crosslinked structure thereby to increase the molecular weight; or a method of reducing the amount of a radical polymerization initiator used for production of the fluorinated copolymer (A) may, for example, be mentioned.

In the production of the fluororesin (A), the molecular weight of a polymer produced in the presence of a chain transfer agent tends to be lower than the molecular weight of a polymer produced in the absence of a chain transfer agent. The molecular weight can be adjusted by the amount of the chain transfer agent to be added. For example, in the case of methanol, the amount to be added is preferably from 0.005 mass % to 0.30 mass %, more preferably from 0.01 mass % to 0.25 mass %, particularly preferably from 0.05 mass % to 0.20 mass %, based on the total amount of a monomer, a chain transfer agent and a polymerization initiator, to be used for production of the fluororesin (A). The chain transfer agent is preferably at least one member selected from the group consisting of methanol, ethanol, methane, ethane, propane, hydrogen and halogenated hydrocarbon, more preferably methanol.

The fluororesin (A) is preferably a fluorinated polymer having the functional group (I) derived from at least one member selected from the group consisting of a monomer, a chain transfer agent and a polymerization initiator, to be used for production of the polymer.

The fluororesin (A) may be a fluororesin having the functional group (I) introduced to a known melt-formable fluororesin.

The melt-formable fluororesin may, for example, be a tetrafluoroethylene/fluoroalkyl vinyl ether copolymer, a tetrafluoroethylene/hexafluoropropylene copolymer, an ethylene/tetrafluoroethylene copolymer, polyvinylidene fluoride, polychlorotrifluoroethylene or an ethylene/chlorotrifluoroethylene copolymer.

Hereinafter, the fluorinated polymer having the functional group (I) derived from a monomer, a chain transfer agent or a polymerization initiator, used for production of the polymer, will be explained.

In the fluorinated polymer, by the presence of the functional group (I) as either one or both of a terminal group of the main chain and a pendant group of the main chain, the adhesive strength between the fluororesin layer and the thermoplastic resin layer can be more increased.

The chain transfer agent having the functional group (I) may, for example, be acetic acid, acetic anhydride, methyl acetate, ethylene glycol or propylene glycol.

The radical polymerization initiator having the functional group (I) may, for example, be di-n-propylperoxydicarbonate, diisopropyl peroxycarbonate, tert-butylperoxyisopropylcarbonate, bis(4-tert-butylcyclohexyl)peroxydicarbonate or di-2-ethylhexylperoxydicarbonate.

With a view to easily controlling the content of the functional group (I), the fluorinated polymer having the functional group (I) derived from a monomer is preferred.

With a view to further increasing the adhesive strength, the fluorinated polymer having the functional group (I) derived from a monomer is particularly preferably the following fluorinated polymer.

A fluorinated polymer having monomer units (u1) based on tetrafluoroethylene (hereinafter sometimes referred to as "TFE"), monomer units (u2) based on a cyclic hydrocarbon monomer having an acid anhydride group (hereinafter sometimes referred to as "acid anhydride group-containing cyclic hydrocarbon monomer") and monomer units (u3) based on a fluorinated monomer (excluding TFE).

The acid anhydride group present in the monomer units (u2) corresponds to the functional group (I).

The acid anhydride group-containing cyclic hydrocarbon monomer constituting the monomer units (u2) may, for example, be itaconic anhydride (hereinafter sometimes referred to as "IAH"), citraconic anhydride (hereinafter sometimes referred to as "CAH"), 5-norbornene-2,3-dicarboxylic anhydride (hereinafter sometimes referred to as "NAH") or maleic anhydride. The acid anhydride group-containing cyclic hydrocarbon monomer may be used alone or in combination of two or more. Among them, preferred is NAH from the viewpoint of adhesive strength.

The fluorinated monomer constituting the monomer units (u3) is preferably a fluorinated compound having one polymerizable carbon-carbon double bond, such as a fluoroolefin ((excluding TFE) such as vinyl fluoride, vinylidene fluoride (hereinafter sometimes referred to as "VdF"), trifluoroethylene, chlorotrifluoroethylene (hereinafter sometimes referred to as "CTFE") or hexafluoropropylene (hereinafter sometimes referred to as "HFP")), $CF_2=CFOR^{f1}$ (wherein $R^{f1}$ is a $C_{1-10}$ perfluoroalkyl group which may contain an oxygen atom between carbon atoms), $CF_2=CFOR^{f2}SO_2X^1$ (wherein $R^{f2}$ is a $C_{1-10}$ perfluoroalkylene group which may contain an oxygen atom between carbon atoms, and $X^1$ is a halogen atom or a hydroxy group), $CF_2=CFOR^{f3}CO_2X^2$ (wherein $R^{f3}$ is a $C_{1-10}$ perfluoroalkylene group which may contain an oxygen atom between carbon atoms, and $X^2$ is a hydrogen atom or a $C_{1-3}$ alkyl group), $CF_2=CF(CF_2)_pOCF=CF_2$ (wherein p is 1 or 2), $CH_2=CX^3(CF_2)_qX^4$ (wherein $X^3$ is a hydrogen atom or a fluorine atom, q is an integer of from 2 to 10, and $X^4$ is a hydrogen atom or a fluorine atom) or perfluoro(2-methylene-4-methyl-1,3-dioxolane).

They may be used alone or in combination of two or more.

The fluorinated monomer is preferably at least one member selected from the group consisting of VdF, CTFE, HFP, $CF_2=CFOR^{f1}$ and $CH_2=CX^3(CF_2)_qX^4$, more preferably $CF_2=CFOR^{f1}$ or HFP.

$CF_2=CFOR^{f1}$ is preferably $CF_2=CFOCF_2CF_2CF_3$ (hereinafter sometimes referred to as "PPVE"). $CH_2=CX^3(CF_2)_qX^4$ is preferably $CH_2=CH(CF_2)_4F$ or $CH_2=CH(CF_2)_2F$.

The content of the monomer units (u1) is from 50 to 99.89 mol %, more preferably from 50 to 99.4 mol %, furthermore preferably from 50 to 98.9 mol %, based on 100 mol % of the total of the monomer units (u1), the monomer units (u2) and the monomer units (u3). The content of the monomer units (u2) is preferably from 0.01 to 5 mol %, more preferably from 0.1 to 3 mol %, furthermore preferably from 0.1 to 2 mol %. The content of the monomer units (u3) is preferably from 0.1 to 49.99 mol %, more preferably from 0.5 to 49.9 mol %, furthermore preferably from 1 to 49.9 mol %.

When the proportions of the respective monomer units are within the above ranges, the fluororesin layer will be excellent in heat resistance, chemical resistance and coefficient of elasticity at a high temperature.

When the proportion of the monomer units (u2) is within the above range, the amount of the acid anhydride group in the fluorinated polymer will be appropriate, and the adhesive strength will further increase.

When the proportion of the monomer units (u3) is within the above range, the fluorinated polymer will be excellent in forming property, and the fluororesin layer will be excellent in flexing resistance.

The proportions of the respective monomer units may be calculated by means of e.g. molten NMR analysis, fluorine content analysis and infrared absorption spectrum analysis of the fluorinated polymer.

In a case where the fluorinated polymer comprises the monomer units (u1), the monomer units (u2) and the monomer units (u3), the proportion of the monomer units (u2) being 0.01 mol % corresponds to a content of the acid anhydride group in the fluorinated polymer being 100 groups per $1\times10^6$ carbon atoms in the main chain of the fluorinated polymer. The proportion of the monomer units (u2) being 5 mol % corresponds to a content of the acid anhydride group in the fluorinated polymer being 50,000 groups per $1\times10^6$ carbon atoms in the main chain of the fluorinated polymer.

The fluorinated polymer may contain monomer units based on a dicarboxylic acid (such as itaconic acid, citraconic acid, 5-norbornene-2,3-dicarboxylic acid or maleic acid) corresponding to the acid anhydride group-containing cyclic hydrocarbon monomer, due to partial hydrolysis of the acid anhydride group in the monomer units (u2). In a case where the fluorinated polymer contains monomer units based on the dicarboxylic acid, the proportion of the monomer units is included in the proportion of the monomer units (u2).

The fluorinated polymer may have monomer units (u4) based on a non-fluorinated monomer (excluding the acid anhydride group-containing cyclic hydrocarbon monomer) in addition to the monomer units (u1) to (u3).

Such a non-fluorinated monomer is preferably a non-fluorinated compound having one polymerizable carbon-carbon double bond, and may, for example, be an olefin (such as ethylene or propylene) having at most 3 carbon atoms, or a vinyl ester (such as vinyl acetate). The non-fluorinated monomer may be used alone or in combination of two or more.

The non-fluorinated monomer is preferably ethylene, propylene or vinyl acetate, particularly preferably ethylene.

In a case where the fluorinated polymer has the monomer units (u4), the proportion of the monomer units (u4) is preferably from 5 to 90 mol %, more preferably from 5 to 80 mol %, furthermore preferably from 10 to 65 mol %, based on 100 mol % of the total of the monomer units (u1), the monomer units (u2) and the monomer units (u3).

Based on the total molar amount of all the monomer units in the fluorinated polymer being 100 mol %, the total molar amount of the monomer units (u1), the monomer units (u2) and the monomer units (u3) is preferably at least 60 mol %, more preferably at least 65 mol %, furthermore preferably at least 68 mol %. A preferred upper limit value is 100 mol %.

As preferred specific examples of the fluorinated polymer, a TFE/PPVE/NAH copolymer, a TFE/PPVE/IAH copolymer, a TFE/PPVE/CAH copolymer, a TFE/HFP/IAH copolymer, a TFE/HFP/CAH copolymer, a TFE/VdF/IAH copolymer, a TFE/VdF/CAH copolymer, a TFE/$CH_2=CH(CF_2)_4$F/IAH/ethylene copolymer, a TFE/$CH_2=CH(CF_2)_4$F/CAH/ethylene copolymer, a TFE/$CH_2=CH(CF_2)_2$F/IAH/ethylene copolymer and a TFE/$CH_2=CH(CF_2)_2$F/CAH/ethylene copolymer may be mentioned.

[Another Resin]

Another resin contained the fluororesin layer is not particularly limited so long as it is melt formable. Such another resin may, for example, be a fluororesin other than the fluororesin (A), an aromatic polyester, polyamideimide or a thermoplastic polyimide.

Such another resin is preferably a fluorinated copolymer other than the fluororesin (A), from the viewpoint of electrical reliability.

The fluororesin other than the fluororesin (A) may, for example, be a tetrafluoroethylene/fluoroalkyl vinyl ether copolymer, a tetrafluoroethylene/hexafluoropropylene copolymer or an ethylene/tetrafluoroethylene copolymer.

The melting point of the fluororesin other than the fluororesin (A) is preferably from 280 to 320° C. In a case where the melting point is within the above range, swelling (foaming) of the fluororesin layer due to heat is less likely to occur when the fluororesin layer is exposed to the atmosphere corresponding to solder reflow.

[Additive]

The additive contained in the fluororesin layer is preferably an inorganic filler having a low dielectric constant and low dielectric loss tangent.

As such an inorganic filler, silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, imogolite, sericite, glass fibers, glass beads, silica-based balloons, carbon black, carbon nanotubes, carbon nanohorn, graphite, carbon fibers, glass balloons, carbon burn, wood flour, zinc borate, etc. may be mentioned. Such inorganic fillers may be used alone, or two or more of them may be used in combination.

The inorganic filler may be porous or non-porous. It is preferably porous in that the dielectric constant or dielectric loss tangent is thereby further low.

The inorganic filler may be surface-treated with a surface treatment agent such as a silane coupling agent or a titanate coupling agent in order to improve the dispersibility in the resin.

In a case where an inorganic filler is incorporated, the content of the inorganic filler in the fluororesin layer is preferably from 0.1 to 100 parts by mass, more preferably from 0.1 to 60 parts by mass, based on 100 parts by mass of the fluororesin (A).

<Thermoplastic Resin Layer>

The thermoplastic resin layer is a layer made of the after-described thermoplastic resin film, which contains the thermoplastic resin (B) (excluding the fluororesin (A)). The thermoplastic resin layer may contain another resin (excluding the fluororesin (A)) other than the thermoplastic resin (B) or an additive.

The thermoplastic resin layer may have a single layer structure or a laminated structure having two or more layers.

The thickness of the thermoplastic resin layer is preferably from 0.5 to 2,400 μm, more preferably from 3 to 1,000 μm, furthermore preferably from 5 to 500 μm. When the thickness is at least the above lower limit value, excellent electrical insulating properties will be achieved. When the thickness is at most the above upper limit value, the total thickness of the laminate can be made thin.

The thermoplastic resin layer may be laminated only on the first surface of the fluororesin layer, or may be laminated on the first surface and the second surface of the fluororesin layer. With a view to suppressing warpage of the laminate or obtaining a double-sided metal-clad laminate having excellent electrical reliability, it is preferred that the thermoplastic resin layer is laminated on the first surface and the second surface of the fluororesin layer.

In a case where such thermoplastic resin layers are laminated on the first surface and the second surface of the fluororesin layer, the composition and the thickness of the respective thermoplastic resin layers may be the same or different. With a view to suppressing warpage of the laminate, it is preferred that the composition and the thickness of the respective thermoplastic resin layers are the same.

The thermoplastic resin (B) contained in the thermoplastic resin layer may be one type or two or more types.

The content of the thermoplastic resin (B) in the thermoplastic resin layer is preferably at least 50 mass %, more preferably at least 80 mass %, per 100 mass % of the thermoplastic resin layer, from the viewpoint of the adhesive strength between the thermoplastic resin layer and the fluororesin layer. The upper limit of the content of the thermoplastic resin (B) is not particularly limited, and may be 100 mass %.

[Thermoplastic Resin (B)]

The thermoplastic resin (B) is a thermoplastic resin having a melting point higher by at least 5° C., preferably at least 10° C., more preferably at least 15° C., than the melting point of the fluororesin (A). Further, the melting point is at most 360° C., preferably at most 350° C., more preferably at most 345° C. For example, the melting point is from 280 to 360° C., preferably from 290 to 350° C. When the melting point is within the above range, excellent adhesive strength can be obtained, and delamination is less likely to occur.

As the thermoplastic resin (B), it is possible to use a known melt-formable thermoplastic resin. For example, a polyarylate, a polysulfone, a polyallylsulfone (such as polyether sulfone), an aromatic polyamide, an aromatic polyetheramide, a polyphenylene sulfide, a polyallyl ether ketone, a polyamideimide or a thermoplastic liquid crystal polymer may be mentioned. From the viewpoint of excellent dielectric properties, the thermoplastic liquid crystal polymer is preferred.

[Thermoplastic Liquid Crystal Polymer]

The thermoplastic liquid crystal polymer is a thermoplastic polymer capable of forming an optical anisotropic molten phase. The optical anisotropy at the time of melting can be confirmed by e.g. placing a sample on a hot stage, followed by heating in a nitrogen atmosphere and observing transmitted light of the sample.

As an example of the thermoplastic liquid crystal polymer, a thermoplastic liquid crystal polyester or a thermoplastic liquid crystal polyester amide having an amide bond introduced thereinto may, for example, be mentioned.

Further, the thermoplastic liquid crystal polymer may be a polymer having an imide bond, a carbonate bond, a carbodiimide bond or an isocyanurate-derived bond such as an isocyanurate bond introduced to an aromatic polyester or an aromatic polyester amide. Among them, a thermoplastic liquid crystal polyester is particularly preferred.

The melting point of the thermoplastic liquid crystal polymer is preferably from 280 to 360° C., more preferably from 290 to 350° C.

The thermoplastic liquid crystal polymer is available as a commercial product.

As an example of the thermoplastic liquid crystal polyester, VECSTAR (manufactured by Kuraray Co., Ltd., tradename) or BIAC (manufactured by W. L. Gore & Associates, Inc., tradename) may, for example, be mentioned.

[Another Resin]

Another resin contained in the thermoplastic resin layer is not particularly limited so long as it is melt-formable. Such another resin may, for example, be a thermoplastic polymer such as a polyethylene terephthalate, a modified polyethylene terephthalate, a polyolefin, a polycarbonate, a polyarylate, a polyamide, a polyphenylene sulfide, polyether ether ketone or a fluororesin other than the fluororesin (A).

The melting point of another resin is preferably from 160 to 360° C., more preferably from 200 to 350° C.

[Additive]

The additive contained in the thermoplastic resin layer may be the same as one contained in the fluororesin layer, and the preferred embodiment is also the same.

<Metal Foil Layer>

The metal foil layer is a layer made of a metal foil.

The metal foil is not particularly limited, but may be suitably selected depending upon the application of the laminate. In a case where the laminate is used for electric equipment or electrical apparatus for example, the metal foil may, for example, be a foil made of copper or a copper alloy, a foil made of stainless steel or its alloy, a foil made of nickel or a nickel alloy (including 42 alloy), or a foil made of aluminum or an aluminum alloy. For a usual laminate used for electric equipment or electrical apparatus, a copper foil such as a rolled copper foil or an electrolytic copper foil is widely used, and a copper foil is suitable also in the present invention.

On the surface of the metal foil, an anti-corrosive layer (an oxide coating film of e.g. chromate) or a heat resistant layer may be formed. Further, for the purpose of increasing the adhesive strength to the fluororesin layer, treatment with a coupling agent may, for example, be applied to the surface of the metal foil.

The thickness of the metal foil is not particularly limited so long as a sufficient function can be exhibited depending upon the application of the laminate, but is preferably from 6 to 70 μm, more preferably from 9 to 35 μm.

<Method for Producing Laminate>

The method for producing a laminate of the present invention has a step of heat lamination (hereinafter referred to as heat lamination step) a fluororesin film containing the fluororesin (A) and a thermoplastic resin film containing the thermoplastic resin (B).

(Fluororesin Film)

The fluororesin film is not particularly limited so long as it contains the fluororesin (A). The fluororesin film may be a single layer film or a laminate film having a plurality of films laminated. The thickness of one sheet of the fluororesin film is preferably from 0.5 to 1,000 μm, more preferably from 1 to 20 μm, furthermore preferably from 3 to 20 μm, particularly preferably from 3 to 15 μm.

The fluororesin film may be obtained by e.g. the following methods.

A method of forming the fluororesin (A) itself or a resin composition containing the fluororesin (A) into a film, by a known forming method (such as extrusion or blow-film extrusion).

A method of introducing the functional group (I) into a fluororesin film containing a fluororesin having no functional group (I), by applying known surface treatment such as corona discharge treatment or plasma treatment.

(Thermoplastic Resin Film)

The thermoplastic resin film is not particularly limited so long as it contains the thermoplastic resin (B).

The thermoplastic resin film may be a single layer film or a laminate film having a plurality of films laminated.

The thickness of one sheet of the thermoplastic resin film is preferably from 0.5 to 1,200 μm, more preferably from 3 to 500 μm, furthermore preferably from 5 to 200 μm, particularly preferably from 6 to 50 μm.

The thermoplastic resin film may, for example, be obtained by a method of forming the thermoplastic resin (B) itself or a resin composition containing the thermoplastic resin (B), into a film by a known forming method (such as extrusion or blow-film extrusion).

In a case where the thermoplastic resin (B) is a thermoplastic liquid crystal polymer, it may be stretched as the case requires after forming into a film by extrusion.

The stretching method may be a known method, and either monoaxial stretching or biaxial stretching may be applicable. Preferred is biaxial stretching with a view to more easily controlling molecular orientation degree. Further, as a stretching machine, a known monoaxial stretching machine, a simultaneous biaxial stretching machine or a sequential biaxial stretching machine may, for example, be used.

(Heat Lamination Step)

A heat lamination step is a step of pressuring the fluororesin film and the thermoplastic resin film in an overlaid state (hereinafter referred to as a provisional laminate) while heating the provisional laminate, thereby bonding the fluororesin film and the thermoplastic resin film. The provisional laminate may further have a metal foil on the outside of the thermoplastic resin film. The metal foil and the thermoplastic resin film may be integrally laminated in advance, or the metal foil and the thermoplastic resin film may be separately formed.

The heat lamination step is carried out by using an apparatus having a heating means and a pressuring means of the provisional laminate. For example, a vacuum press apparatus, a double belt press apparatus or a heated roller lamination apparatus may be used, and a known apparatus may be used.

For example, a vacuum press apparatus has a vacuum chamber and a pair of hotplates for pressuring the provisional laminate while heating it, a double belt press apparatus has at least a pair of metal belts for pressuring the provisional laminate while heating it, and a heated roller lamination apparatus has at least a pair of metal rollers for pressuring the provisional laminate while heating it.

Among them, a vacuum press apparatus or a double belt press apparatus is preferred with a view to stably pressuring the provisional laminate continuously for a predetermined time.

In the heat lamination step, the fluororesin film and the thermoplastic resin film constituting the provisional laminate are heated to the same temperature (heat lamination temperature) as the surface temperature for the means for pressuring the provisional laminate.

The melting point of the thermoplastic resin (B) is higher than the melting point of the fluororesin (A), and the difference of the melting point is at least 5° C. The heat lamination temperature is at least the melting point of the fluororesin (A) and further lower than the melting point of the thermoplastic resin (B).

When the fluororesin film and the thermoplastic resin film are bonded at a temperature of at least the melting point of the fluororesin (A), a good adhesive strength between the fluororesin layer and the thermoplastic resin layer in the laminate is achieved. When the heat lamination temperature is lower than the melting point of the thermoplastic resin (B), a good interface between the fluororesin layer and the thermoplastic resin layer of the laminate is achieved.

The heat lamination temperature is preferably higher by at least 20° C., more preferably higher by at least 30° C., than the melting point of the fluororesin (A). The heat lamination temperature is preferably lower by at least 3° C., more preferably lower by at least 5° C., than the melting point of the thermoplastic resin (B). For example, the heat lamination temperature is preferably from 280° C. to 357° C., more preferably from 300° C. to 355° C., furthermore preferably from 315° C. to 350° C. When the heat lamination temperature in the present invention is within the above range, a good adhesive strength can be achieved and delamination is less likely to occur.

If the heat lamination pressure is too low, the adhesive strength would be insufficient, but if it is too high, the interface between the fluororesin layer and the thermoplastic resin layer tends to have deformation such as waving.

For example, in the vacuum press step, the pressure (heat lamination pressure) between a pair of hotplates is preferably from 0.5 to 7 MPa, more preferably from 1 to 6 MPa, furthermore preferably from 2 to 5 MPa.

If the heat lamination time is too short, the adhesive strength would be insufficient, but if it is too long, adhesion failure or coloration due to decomposition of functional groups tends to occur and further productivity tends to reduce.

For example, in the vacuum press step, the time (heat lamination time) pressuring by the pair of hotplates is preferably at least 30 seconds, more preferably at least 120 seconds, particularly preferably at least 180 seconds.

The adhesive strength at the interface between the fluororesin layer and the thermoplastic resin layer in the laminate is preferably at least 10 N/cm, more preferably at least 12 N/cm, furthermore preferably at least 14 N/cm.

In the heat lamination step, a protective material may be interposed between the provisional laminate and the pressuring means to be in contact therewith. The protective material is not particularly limited so long as it withstands the heating temperature at the time of the heat lamination, and may, for example, be a heat resistant plastic film (such as a non-thermoplastic polyimide film) or a metal foil (such as a copper foil, an aluminum foil or a SUS foil). A non-thermoplastic polyimide film is preferred in view of excellent balance between the heat resistance, the recycle ability, etc.

The thickness of the non-thermoplastic polyimide film is preferably at least 75 µm. If the non-thermoplastic polyimide film is thin, the protective film may not sufficiently fulfill the role as a buffer and a protector at the time of heat lamination.

The protective material may be a single layer structure or a multilayer structure of two or more layers.

(Post Step)

In a case where warpage occurs to the laminate in the heat lamination step, a step of curing the warpage of the laminate may be provided.

The curing of the warpage of the laminate is carried out by applying heat treatment to the laminate at a temperature of at least 100° C. and less than 250° C. (preferably at least 150° C. and less than 250° C., more preferably at least 180° C. and less than 250° C.).

Further, in order to improve heat resistance of the laminate to a soldering iron, the laminate may be subjected to heat treatment so as to reduce the melt flow rate of the fluororesin (A). The heat treatment temperature is preferably at least 370° C., more preferably at least 380° C.

Further, the laminate may be subjected to the heat treatment at a temperature of at least the melting point of the fluororesin (A) in a low oxygen-concentration atmosphere such as an inert gas atmosphere of e.g. a nitrogen or argon atmosphere, or under reduced pressure or vacuum, whereby it is possible to improve dimension stability at the time of subjecting the after-described flexible printed circuit board to a solder reflow step or other heat treatment steps (such as cover lay attachment). As heat treatment conditions, preferred is from 5 seconds to 48 hours at (the melting point of fluororesin (A)+ at least 10° C. and at most 120° C.), more preferred is from 30 seconds to 36 hours at (the melting point of fluororesin (A)+ at least 30° C. and at most 100° C.), furthermore preferred is from 1 minute to 24 hours at (the melting point of fluororesin (A)+ at least 40° C. and at most 80° C.). Further, the adhesive strength between the fluororesin layer and the thermoplastic resin film is improved by this heat treatment. In a case where this heat treatment is applied, it is possible to obtain a laminate having sufficiently high adhesive strength of the interface even when the heat lamination pressure in the heat lamination step is lowered. Further, if the heat lamination pressure is too high, the dimension stabilities of the laminate and further the after-described flexible printed circuit board tend to worsen, but in a case where this heat treatment is carried out, it is possible to improve the dimension stability by lowering the heat lamination pressure.

According to the present invention, a fluororesin film having a specific functional group (I) and having a melt flow rate within the above specific range is subjected to heat lamination with a thermoplastic resin film at a specific temperature, whereby it is possible to obtain a sufficient adhesive strength. The reason is not clear, but it is supposed that, when the melt flow rate of the fluororesin film is at least the lower limit value of the above range, the melt flowability is secured at the time of the heat lamination, and the thermoplastic resin film and the fluororesin having the functional group (I) are sufficiently contacted so as to undergo a reaction, whereby a good adhesive strength can be obtained. Further, it is supposed that, when the melt flow rate of the fluororesin film is at most the upper limit value of the above range, the molecular weight is not too small and has a suitable size, the interaction due to entanglement between fluororesins becomes strong, and as a result, the adhesive strength between the thermoplastic resin film and the fluororesin film can be sufficiently obtained.

<Printed Circuit Board>

The printed circuit board of the present invention has a patterned circuit formed by etching a metal foil layer of the laminate of the present invention for removing unnecessary portions.

That is, the printed circuit board of the present invention is a printed circuit board having a fluororesin layer, a thermoplastic resin laminated on at least one surface of the fluororesin layer, and a patterned circuit provided on a surface of the thermoplastic resin layer opposite from the surface contacting the fluororesin layer.

The printed circuit board of the present invention may be provided with various down sized and high density members.

EXAMPLES

Now, the present invention will be described in further detail with reference to Examples of the present invention, however, it should be understood that the present invention is by no means restricted thereto.

[Measurement Method]

(Copolymer Composition)

The copolymer composition of the fluororesin (A) is determined by molten NMR analysis, fluorine content analysis and infrared absorption spectrum analysis.

(Content of Functional Group (I))

The proportion of constituting units derived from NAH having a functional group (I) in the fluororesin (A) was obtained by the following infrared absorption spectrum analysis.

The fluororesin (A) was pressed to obtain a film having a thickness of 200 μm. In the infrared absorption spectrum, the absorption peak of the constituting units derived from NAH in the fluororesin (A) appears at 1,778 cm$^{-1}$. By measuring the absorbance of the absorption peak and using the molar extinction coefficient of NAH being 20,810 mol$^{-1}$·l·cm$^{-1}$, the proportion (mol %) of the constituting units derived from NAH was obtained.

The number of the functional groups (I) (acid anhydride groups) per $1 \times 10^6$ carbon atoms in the main chain is calculated to be $[a \times 10^6/100]$ groups, where a (mol %) is the above proportion.

(Melting Point)

Using a differential scanning calorimeter (manufactured by Seiko Instruments & Electronics Ltd., DSC apparatus), the melting peak at the time of heating a resin at a rate of 10° C./min was recorded, and the temperature (° C.) corresponding to the maximum value was taken as the melting point.

(Melt Flow Rate)

Using a melt indexer (manufactured by TECHNOL SEVEN CO., LTD.), the mass (g) of the fluororesin (A) flowing out from a nozzle with a diameter of 2 mm and a length of 8 mm in 10 minutes at 372° C. under a load of 49 N, was measured.

(Adhesive Strength)

The adhesive strength at the interface between the fluororesin layer and the thermoplastic resin was measured by the following method.

A laminate was cut into a rectangular shape having a length of 150 mm and a width of 10 mm to obtain an evaluation sample. From one end in the longitudinal direction of the evaluation sample to a position of 50 mm from the end, the thermoplastic resin layer and the fluororesin layer were peeled. Then, they were peeled by means of a tensile tester so as to be 90° at a tensile speed of 50 mm/min., whereby the maximum load was taken as the adhesive strength (N/cm).

In a case where a plurality of interfaces between the fluororesin layer and the thermoplastic resin layer are present in the laminate, measurement is carried out by peeling the thermoplastic resin layer and the fluororesin layer at an arbitrary one interface.

Production Example 1: Production of Fluororesin (A-1)

NAH (anhydrous High-mix acid, manufactured by Hitachi Chemical Co., Ltd.) as a monomer to form the monomer units (u2) and PPVE (CF$_2$=CFO(CF$_2$)$_3$F, perfluoropropyl vinyl ether, manufactured by Asahi Glass Company, Limited) as a monomer to form the monomer units (u3), were prepared.

A polymerization initiator solution was prepared by dissolving (perfluorobutyryl) peroxide at a concentration of 0.36 mass % in 1,3-dichloro-1,1,2,2,3-pentafluoropropane (AK225cb, manufactured by Asahi Glass Company, Limited).

A NAH solution was prepared by dissolving NAH at a concentration of 0.3 mass % in AK225cb.

369 kg of AK225cb, 30 kg of PPVE and 0.36 kg of methanol were charged into a preliminarily degassed polymerization vessel having an internal capacity of 430 L and equipped with a stirrer. The inside of the polymerization vessel was heated to raise the temperature to 50° C., and 50 kg of TFE was further charged, whereupon the pressure in the polymerization vessel was raised to 0.89 MPa [gage].

3 L of the polymerization initiator solution was continuously added at a rate of 6.25 mL/min. into the polymerization vessel, to carry out polymerization. Further, TFE was continuously charged in order to maintain the pressure in the polymer vessel during the polymerization reaction to be 0.89 MPa [gage]. Further, the NAH solution was charged continuously by an amount corresponding to 0.1 mol % based on moles of TFE to be charged during the polymerization.

After 8 hours from the initiation of polymerization, when 32 kg of TFE was charged, the temperature in the polymerization vessel was lowered to room temperature, and the pressure was purged to atmospheric pressure. The obtained slurry was separated from AK225cb by solid-liquid separation and dried at 150° C. for 15 hours to obtain 33 kg of fluororesin (A-1).

Production Example 2: Production of Fluororesin (A-2)

33 kg of fluororesin (A-2) was obtained in the same manner as in Production Example 1 except that the charged amount of methanol was changed to 0.56 kg in Production Example 1.

Production Example 3: Production of Fluororesin (A-3)

33 kg of fluororesin (A-3) was obtained in the same manner as in Production Example 1 except that the charged amount of methanol was changed to 0.64 kg in Production Example 1.

[Properties of Fluororesins (A-1) to (A-3)]

The specific gravity of each of fluororesins (A-1) to (A-3) was 2.15.

The copolymer composition of each of fluororesins (A-1) to (A-3) was such that the monomer units based on TFE/monomer units based on NAH/monomer units based on PPVE=97.9/0.1/2.0 (mol %).

The melting point of each of fluororesins (A-1) to (A-3) was 305° C.

The melt flow rates of fluororesins (A-1) to (A-3) were respectively 11.0 g/10 min, 29.0 g/10 min and 40.0 g/10 min.

The content of the functional group (I) (acid anhydride group) of each of the fluororesins (A-1) to (A-3) was 1,000 groups per $1 \times 10^6$ carbon atoms in the main chain of the fluororesin.

Production Example 4: Production of Fluororesin Film (1)

Fluororesin (A-1) obtained in Production Example 1 was extruded at a die temperature of 340° C. by means of a single screw extruder having a diameter of 30 mm and having a 750 mm width coat hanger die, to obtain fluororesin film (1) having a thickness of 50 μm.

Production Example 5: Production of Fluororesin Film (2)

Fluororesin film (2) having a thickness of 50 μm was obtained in the same manner as in Production Example 4 except that fluororesin (A-2) obtained in Production Example 2 was used.

Production Example 6: Production of Fluororesin Film (3)

Fluororesin film (3) having a thickness of 50 μm was obtained in the same manner as in Production Example 4 except that fluororesin (A-3) obtained in Production Example 3 was used.

Ex. 1 to 5: Production of Laminate

A laminate having a structure shown in FIG. 2 was produced under the conditions shown in Table 1. Ex. 1 to 3 are Examples of the present invention. Ex. 4 and Ex. 5 are Comparative Examples. As a fluororesin film, fluororesin films (1) to (3) obtained in Production Examples 4 to 6 were used.

As a thermoplastic resin film, thermoplastic liquid crystal polymer film (1) having a thickness of 50 μm (VECSTAR (manufactured by Kuraray Co., Ltd., tradename), melting point 340° C.) was used.

As a metal foil, an electrolytic copper foil having a thickness of 12 μm (manufactured by Fukuda Metal Foil and Powder Co., Ltd., CF-T4X-SVR-12, Rz: 1.2 μm) was used.

The production of the laminate was carried out by using a vacuum press apparatus. In particular, the metal foil, the thermoplastic resin film, the fluororesin film, the thermoplastic resin film and the metal foil were laminated in this order, and pressured and heated at a temperature and pressure shown in Table 1 for 600 seconds to obtain a laminate.

(Evaluation)

With respect to the laminate obtained in each Ex., the adhesive strength of the interface between the fluororesin layer and the thermoplastic resin layer was measured. The result is shown in Table 1. Further, the appearance of the interface between the fluororesin layer and the thermoplastic resin layer of each laminate was visually observed, whereupon the interface in each of Ex. 1 to Ex. 5 was flat, and therefore the appearance was good.

TABLE 1

| | Fluororesin film | | | Thermoplastic resin film | | Heating and pressuring conditions | | | Adhesive |
|---|---|---|---|---|---|---|---|---|---|
| | Type | Melting point [° C.] | Melt flow rate [g/10 min] | Type | Melting point [° C.] | Temperature [° C.] | Pressure [MPa] | Pressuring time [sec] | strength [N/cm] |
| Ex. 1 | Fluororesin film (1) | 305 | 11.0 | Thermoplastic liquid crystal polymer film (1) | 340° C. | 330 | 4 | 600 | 21.8 |
| Ex. 2 | | | | | | 335 | 4 | 600 | 22.2 |
| Ex. 3 | Fluororesin film (2) | 305 | 29.0 | | | 330 | 4 | 600 | 17.5 |
| Ex. 4 | Fluororesin film (3) | 305 | 40.0 | | | 330 | 4 | 600 | 9.4 |
| Ex. 5 | | | | | | 335 | 4 | 600 | 9.1 |

As shown in Table 1, in Ex. 1 to Ex. 3 using, as a fluororesin film to be bonded to a thermoplastic resin film, the fluororesin film (1) having the functional group (I) and having a melt flow rate within the range of the present invention, sufficient adhesive strength was obtained.

INDUSTRIAL APPLICABILITY

The laminate obtained by the method for producing a laminate of the present invention is useful for production of a flexible printed circuit board which is required to have a high level of electrical reliability.

This application is a continuation of PCT Application No. PCT/JP2017/014691, filed on Apr. 10, 2017, which is based upon and claims the benefit of priority from Japanese Patent Application No. 2016-78950 filed on Apr. 11, 2016. The contents of those applications are incorporated herein by reference in their entireties.

REFERENCE SYMBOLS

10: laminate, 12: fluororesin layer, 14: thermoplastic resin layer, 16: metal foil layer

What is claimed is:

1. A laminate, comprising
a fluororesin layer comprising a fluororesin and
a thermoplastic resin layer comprising a thermoplastic resin, directly laminated on at least one side of the fluororesin layer,
wherein the fluororesin has at least one functional group selected from the group consisting of a carbonyl group-comprising group, a hydroxy group, an epoxy group and an isocyanate group, and has a melting point of from 280 to 315° C. and a melt flow rate of from 0.5 to 30 g/10 min at 372° C. under a load of 49N, and
the thermoplastic resin has a melting point higher by at least 5° C. than the melting point of the fluororesin, and is a thermoplastic liquid crystal polymer.

2. The laminate of claim 1, wherein the thermoplastic liquid crystal polymer is selected from the group consisting of a thermoplastic liquid crystal polyester, a thermoplastic liquid crystal polyester amide having an amide bond introduced into the thermoplastic liquid crystal polyester, and a polymer having an imide bond, a carbonate bond, a carbodiimide bond or an isocyanate-derived bond introduced into an aromatic polyester or an aromatic polyester amide.

3. The laminate of claim 1, wherein the melting point of the thermoplastic resin is lower than 360° C.

4. The laminate of claim 1, wherein the fluororesin is a fluorinated polymer having a functional group derived from at least one member selected from the group consisting of a monomer, a chain transfer agent and a polymerization initiator, to be used for production of a polymer.

5. The laminate of claim 1, wherein the fluororesin has monomer units based on tetrafluoroethylene, monomer units based on a cyclic hydrocarbon monomer having an acid anhydride group and monomer units based on a fluorinated monomer, wherein the fluorinated monomer is not tetrafluoroethylene.

6. The laminate of claim 1, which has a metal foil layer on a surface of the thermoplastic resin layer opposite from the surface contacting the fluororesin layer.

7. A printed circuit board, comprising the laminate of claim 6, wherein the metal foil layer is a patterned circuit.

8. A method for producing a laminate, said method comprising heat laminating a fluororesin film comprising a fluororesin and a thermoplastic resin film comprising a thermoplastic resin, at a heat lamination temperature of at least a melting point of the fluororesin and lower than a melting point of the thermoplastic resin,
   wherein the fluororesin has at least one functional group selected from the group consisting of a carbonyl group-comprising group, a hydroxy group, an epoxy group and an isocyanate group, and has a melt flow rate of from 0.5 to 30 g/10 min at 372° C. under a load of 49N,
   the melting point of the fluororesin is from 280 to 315° C.,
   the melting point of the thermoplastic resin is higher by at least 5° C. than the melting point of the fluororesin, and
   the thermoplastic resin is a thermoplastic liquid crystal polymer.

9. The method of claim 8, wherein the heat lamination temperature is higher by at least 20° C. than the melting point of the fluororesin and further lower by at least 3° C. than the melting point of the thermoplastic resin.

10. The method of claim 8, wherein the heat lamination temperature is from 280 to 357° C.

11. The method of claim 8, wherein a heat lamination pressure of the heat laminating is from 0.5 to 7 MPa.

12. The method of claim 8, wherein the thermoplastic liquid crystal polymer is selected from the group consisting of a thermoplastic liquid crystal polyester, a thermoplastic liquid crystal polyester amide having an amide bond introduced into the thermoplastic liquid crystal polyester, and a polymer having an imide bond, a carbonate bond, a carbodiimide bond or an isocyanate-derived bond introduced into an aromatic polyester or an aromatic polyester amide.

13. The method of claim 8, wherein the fluororesin comprises monomer units based on tetrafluoroethylene, monomer units based on a cyclic hydrocarbon monomer having an acid anhydride group and monomer units based on a fluorinated monomer, wherein the fluorinated monomer is not tetrafluoroethylene.

14. The method of claim 10, wherein the heat lamination temperature is from 300 to 355° C.

* * * * *